United States Patent
Jain

(10) Patent No.: US 11,429,478 B2
(45) Date of Patent: Aug. 30, 2022

(54) ROBUST SOFT ERROR TOLERANT MULTI-BIT D FLIP-FLOP CIRCUIT

(71) Applicant: STMicroelectronics International N.V., Geneva (CH)

(72) Inventor: Abhishek Jain, Noida (IN)

(73) Assignee: STMicroelectronics International N.V., Geneva (CH)

(*) Notice: Subject to any disclaimer, the term of this patent is extended or adjusted under 35 U.S.C. 154(b) by 156 days.

(21) Appl. No.: 16/867,325

(22) Filed: May 5, 2020

(65) Prior Publication Data

US 2020/0387426 A1 Dec. 10, 2020

Related U.S. Application Data

(60) Provisional application No. 62/857,668, filed on Jun. 5, 2019.

(51) Int. Cl.

| | |
|---|---|
| *G06F 11/10* | (2006.01) |
| *G06F 11/30* | (2006.01) |
| *G06F 11/07* | (2006.01) |
| *G06F 11/32* | (2006.01) |
| *G06F 11/16* | (2006.01) |

(52) U.S. Cl.
CPC ........ *G06F 11/1068* (2013.01); *G06F 11/076* (2013.01); *G06F 11/1044* (2013.01); *G06F 11/1604* (2013.01); *G06F 11/3058* (2013.01); *G06F 11/327* (2013.01)

(58) Field of Classification Search
CPC .............. G06F 11/1068; G06F 11/076; G06F 11/1044; G06F 11/1604; G06F 11/3058; G06F 11/327; G06F 11/1048; G11C 7/222; G11C 29/52; G11C 2029/0411
USPC ....................................................... 714/752
See application file for complete search history.

(56) References Cited

U.S. PATENT DOCUMENTS

| | | | |
|---|---|---|---|
| 6,975,238 B2 | 12/2005 | Schneider | |
| 7,702,992 B2 | 4/2010 | Ogawa | |
| 8,402,328 B2 | 3/2013 | Wang et al. | |
| | (Continued) | | |

OTHER PUBLICATIONS

Alghareb et al., "Soft Error Effect Tolerant Temporal Self-Voting Checkers: Energy vs. Resilience Tradeoffs," IEEE, 2016, 6 pages.

(Continued)

*Primary Examiner* — James C Kerveros
(74) *Attorney, Agent, or Firm* — Seed IP Law Group LLP

(57) ABSTRACT

A circuit and methods of operation thereof are provided for robust protection against soft errors. The circuit includes a first set of storage elements coupled to and configured to sample a set of data inputs at a first set of times. The circuit includes a second set of storage elements coupled to and configured to sample the set of data inputs at a second set of times. A first parity generator generates a first parity check for the set of data inputs and a second parity generator generates a second parity check for output of the first set of storage elements. An error correction unit compares the first parity check and the second parity check to detect occurrences of error conditions in the circuit. The error correction unit may control output or operating characteristics of the circuit as a result of error conditions detected.

29 Claims, 5 Drawing Sheets

(56) References Cited

U.S. PATENT DOCUMENTS

| | | | |
|---|---|---|---|
| 8,589,775 B2 * | 11/2013 | Georgakos | G06F 11/1032 714/801 |
| 9,165,917 B2 | 10/2015 | Cannon et al. | |
| 9,529,671 B2 | 12/2016 | Chandra et al. | |
| 2006/0005091 A1 * | 1/2006 | Mitra | G01R 31/31816 714/726 |

OTHER PUBLICATIONS

Andjelković et al., "SET Response of a SEL Protection Switch for 130 and 250 nm CMOS Technologies," *2016 IEEE 22 $^{nd}$ International Symposium on On-Line Testing and Robust System Design (IOLTS)*, 2016, pp. 185-190.

Baumann, "Radiation-Induced Soft Errors in Advanced Semiconductor Technologies," *IEEE Transactions on Device and Materials Reliability* 5(3):305-316, 2005.

Gaspard et al., "Technology Scaling Comparison of Flip-Flop Heavy-Ion Single-Event Upset Cross Sections," *IEEE Transactions on Nuclear Science* 60(6):4368-4373, 2013.

Haghi et al., "The 90 nm Double-DICE Storage Element To Reduce Single-Event Upsets," IEEE, 2009, pp. 463-466.

Hazucha et al., "Impact of CMOS Technology Scaling on the Atmospheric Neutron Soft Error Rate," *IEEE Transactions on Nuclear Science* 47(6):2586-2594, 2000.

Jahinuzzaman et al., "TSPC-DICE: A Single Phase Clock High Performance SEU Hardened Flip-flop," IEEE, 2010, pp. 73-76.

Uznanski et al., "Single Event Upset and Multiple Cell Upset Modeling in Commercial Bulk 65-nm CMOS SRAMs and Flip-Flops," *IEEE Transactions on Nuclear Science* 57(4):1876-1883, 2010.

Yuan et al., "New Single-Clock CMOS Latches and FlipFlops with Improved Speed and Power Savings," *IEEE Journal of Solid-State Circuits* 32(1):62-69, 1997.

* cited by examiner

ROBUST SOFT ERROR TOLERANT MULTI-BIT D FLIP-FLOP CIRCUIT

BACKGROUND

Technical Field

The present disclosure relates to sequential storage circuits and, more particularly, to soft-error tolerant sequential storage circuits.

Description of the Related Art

Single Event Effects (SEE), which are electrical disruptions to electrical circuits, can be caused by a particle (e.g., ion, proton) passing through a sensitive node in the circuit. Due to the proliferation of nanometer scale technologies, SEE particle strikes on silicon have become a prominent source of device failures and malfunction in recent years. In aerospace and medical applications, for example, where a single failure of an electronic component can have disastrous impact on human life, such failures must be avoided at all costs. Even in areas of less sensitive technologies, such as transportation and telecommunications, failures of electronic components can cause substantial economic loss.

SEE can be categorized into at least two categories: Single Event Upsets (SEUs) and Single Event Transients (SETs). In SEUs, malfunction or failure may occur when a stored value in a sequential element is altered to a particle strike. In SETs, malfunction or failure may occur when an incorrect value is latched or stored into a sequential element due to transition delay in a combinational path.

Circuit designs have been developed directed to improving tolerance against radiation and particle strikes, most of which focus on implementing redundancy of devices. Popular methods adopted in the industry include Dual Interlocked Storage Cells (DICE), Triple Modular Redundancy (TMR), and Dual Modular Redundancy (DMR), among others. Of these methods, TMR designs show somewhat promising tolerance against strikes; however, a circuit design that is robust against both SETs and SEUs has eluded developers thus far. TMR designs are tolerant to some degree to SEUs, but fail to provide protection against malfunction or failure due to SETs.

Moreover, existing designs sacrifice cost and performance for robustness. For instance, TMR designs have high cost and power requirements, while the performance of such TMR designs is limited when compared to at least some other configurations. Designing a circuit that is robust to both SEUs and SETs, and which has high performance and low cost characteristics, has proven to be a difficult challenge.

BRIEF SUMMARY

The present disclosure includes embodiments of a logic circuit that is robust against numerous types of SEEs and the effects thereof. The logic circuit has a first set of storage elements that sample data from a set of data inputs according to a first clock signal and a second set of storage elements that sample data from the set of data inputs according to a second clock signal different than the first clock signal. The logic circuit also includes a first parity generator that generates a first parity check based on data from the set of data inputs and a second parity generator that generates a second parity check based on output from the first set of storage elements. An error correction unit controls output from the logic circuit based on a comparison between the first parity check and the second parity check. The error correction unit, in some embodiments, may adjust operational characteristics of the logic circuit based on a set of errors detected in the logic circuit.

A time delay is provided between a first time at which the data is sampled from the set of data inputs and a second time at which the error correction unit receives the first parity check. Due to the time delay, the first parity check corresponds to a state of data on the set of data inputs at a previous time. The error correction unit may determine the occurrence of an error condition based on a difference between the first parity check and the second parity check. As a result of the time delay, the error correction unit can detect more than one type of SEE and the logic circuit is therefore more robust than previously-implemented circuits. In some embodiments, the time delay may be selectively adjustable to adjust a timing window for detecting errors. The present disclosure also includes embodiments of systems implementing the logic circuit, and methods of operation of the logic circuit.

One or more embodiments of the present disclosure include a device. The device also includes a set of data inputs. The device also includes a first clock having a first clock signal. The device also includes a second clock having a second clock signal that is different from the first clock signal. The device also includes a first set of storage elements coupled to the set of data inputs and coupled to the first clock. The device also includes a second set of storage elements coupled to the set of data inputs and coupled to the second clock. The device also includes a first parity generator coupled to the set of data inputs. The device also includes a second parity generator coupled to the first set of storage elements. The device also includes an error correction unit coupled to the first parity generator and the second parity generator. Other embodiments of this aspect include corresponding computer systems, apparatus, and computer programs recorded on one or more computer storage devices, each configured to perform the actions of the methods.

According to an embodiment, the device may include a parity storage element coupled between the first parity generator and the error correction unit. The device may include a delay unit coupled between the first parity generator and the parity storage element. The parity storage element is coupled to the first clock. The device may include a set of output selection units coupled to the first set of storage elements and coupled to the second set of storage elements. The set of output selection units output a first output of the first set of storage elements or a second output of the second set of storage elements in response to a signal from the error correction unit. Each storage element of the first set of storage elements includes a reset input and each storage element of the second set of storage elements includes a reset input, the device may include a first reset path coupled to the reset inputs of the first set of storage elements for providing a reset signal; and a second reset line connected to the reset inputs of the second set of storage elements for separately providing the reset signal. The first reset path is coupled to the reset input of the parity storage element. Each storage element of the first set of storage elements includes a clock signal input, the device may include a set of glitch filters each having a filter output coupled to the clock signal input of each of the first set of storage elements and each having a filter input coupled to the first clock.

One or more embodiments of the present disclosure include a circuit. The circuit also includes a set of data inputs. The circuit also includes a first set of storage elements that receive first data from the set of data inputs at a set of first defined clock events. The circuit also includes a second set of storage elements that receive second data from the set of data inputs at a set of second defined clock events. The circuit also includes an error correction unit that. The circuit also includes performs a comparison between a time delayed first parity check of input data from the set of data inputs and a second parity check of the first data. The circuit also includes determines an occurrence of an error condition based on a result of the comparison. The circuit also includes controls an operating characteristic of the circuit based on the error condition determined. The circuit also includes outputs the first data or the second data based on the comparison.

According to an embodiment, the error correction unit determines the occurrence of the error condition based on an error rate of the circuit, and controls at least one set of times of the set of first defined clock events and the set of second defined clock events based on the occurrence of the error condition determined. The error correction unit determines the error condition based on an error rate of the circuit, and controls a power characteristic of at least one set of storage elements of the first set of storage elements and the second set of storage elements based on the error condition determined. The circuit may include a first parity check generator that generates a first parity check at a first time based on the input data from the set of data inputs; a delay unit that receives the first parity check and generates the time delayed first parity check that includes the first parity check delayed in time by a defined time delay; and a storage element having an input that receives the time delayed first parity check at a second time and provides an output to the error correction unit. The error correction unit is configured to determine a first error condition corresponding to a systematic error in the circuit as a result of a plurality of differences between the time delayed first parity check and the second parity check, and controls the operating characteristic in response to the first error condition determined. The error correction unit is configured to determine a second error condition corresponding to a single event upset as a result of detection of an isolated difference between the time delayed first parity check and the second parity check.

One or more embodiments of the present disclosure include a method of operating a logic circuit. The method of operating also includes receiving, from a first parity generator, a first parity check indicating parity of data sampled at a first time by a first set of storage elements. The operating also includes receiving, from a second parity generator, a second parity check indicating parity of data sampled at a second time subsequent to the first time by the first set of storage elements. The operating also includes detecting a first difference between the first parity check and the second parity check. The operating also includes determining, as a result of detecting the first difference, an occurrence of a single event effect in the logic circuit. The operating also includes outputting the data sampled at the second time by a second set of storage elements.

According to an embodiment, the method may include receiving, from the first parity generator, a third parity check indicating parity of data sampled at a third time after the first time by the first set of storage elements; receiving, from the second parity generator, a fourth parity check indicating parity of data sampled at a fourth time by the first set of storage elements; detecting a second difference between the third parity check and the second parity check; and determining, as a result of detecting the first difference and the second difference within a defined period of time, an occurrence of a timing error in the logic circuit. The method may include modifying an operating characteristic of the logic circuit in response to determining the occurrence of the timing error. The operating characteristic is a power characteristic of the logic circuit. The operating characteristic is a clock rate of at least one clock signal of a first clock signal and a second clock signal.

One or more embodiments of the present disclosure include a system. The system also includes a set of data inputs. The system also includes a first clock. The system also includes a second clock. The system also includes a first set of storage elements coupled to the set of data inputs and coupled to the first clock. The system also includes a second set of storage elements coupled to the set of data inputs and coupled to the second clock. The system also includes a first parity generator coupled to the set of data inputs. The system also includes a second parity generator coupled to the first set of storage elements. The system also includes a set of output selection units coupled to the first set of storage elements and the second set of storage elements, the set of output selection units that selectively provide data from first outputs of the first set of storage elements or second outputs of the second set of storage elements. The system also includes an error correction unit coupled to the first parity generator and the second parity generator.

According to an embodiment, the system where the first set of storage elements samples the set of data inputs at a first time and the second set of storage elements samples the set of data inputs at a second time. The first parity generator generates a first parity check and the second parity generator generates a second parity check. The error correction unit is configured to detect an error status based on a difference between the first parity check and the second parity check, select output from the first set of storage elements or the second set of storage elements in response to a first error condition for the error status, and control an operating characteristic of at least one set of the first set of storage elements and the second set of storage elements in response to a second error condition for the error status. The first error condition corresponds to a systematic error and the second error condition corresponds to a single event error. The system may include a parity storage element that obtains the first parity check at the first time and provides an output to the error correction unit based on the first parity check; and a delay unit that provides a time delay between a time at which the first parity check is generated and the first time. The error correction unit adjusts a timing of the first clock or the second clock as a result of determining the second error condition. The error correction unit adjusts a power characteristic of power supplied to at least one set of storage elements of the first set of storage elements and the second set of storage elements based on the error status determined. The system may include a dynamic scaling unit that causes adjustment for at least one timing of the first time or the second time based on the error status determined.

DETAILED DESCRIPTION

The following description, along with the accompanying drawings, sets forth certain specific details in order to provide a thorough understanding of various disclosed embodiments. However, one skilled in the relevant art will recognize that the disclosed embodiments may be practiced in various combinations, without one or more of these specific details, or with other methods, components, devices, materials, etc. In other instances, well-known structures or components that are associated with the environment of the present disclosure, including but not limited to the communication systems and networks and the environment, have not been shown or described in order to avoid unnecessarily obscuring descriptions of the embodiments. Additionally, the various embodiments may be methods, systems, media, or devices. Accordingly, the various embodiments may be entirely hardware embodiments, or embodiments combining hardware aspects.

Throughout the specification, claims, and drawings, the following terms take the meaning explicitly associated herein, unless the context clearly dictates otherwise. The term "herein" refers to the specification, claims, and drawings associated with the current application. The phrases "in one embodiment," "in another embodiment," "in various embodiments," "in some embodiments," "in other embodiments," and other variations thereof refer to one or more features, structures, functions, limitations, or characteristics of the present disclosure, and are not limited to the same or different embodiments unless the context clearly dictates otherwise. As used herein, the term "or" is an inclusive "or" operator, and is equivalent to the phrases "A or B, or both" or "A or B or C, or any combination thereof," and lists with additional elements are similarly treated. The term "based on" is not exclusive and allows for being based on additional features, functions, aspects, or limitations not described, unless the context clearly dictates otherwise. In addition, throughout the specification, the meaning of "a," "an," and "the" include singular and plural references.

References to the term "set" (e.g., "a set of items"), as used herein, unless otherwise noted or contradicted by context, is to be construed as a nonempty collection comprising one or more members or instances. The term "set" should not be confused with the acronym "SET," as also used herein, which refers to a Single Event Transient.

Figure 1:
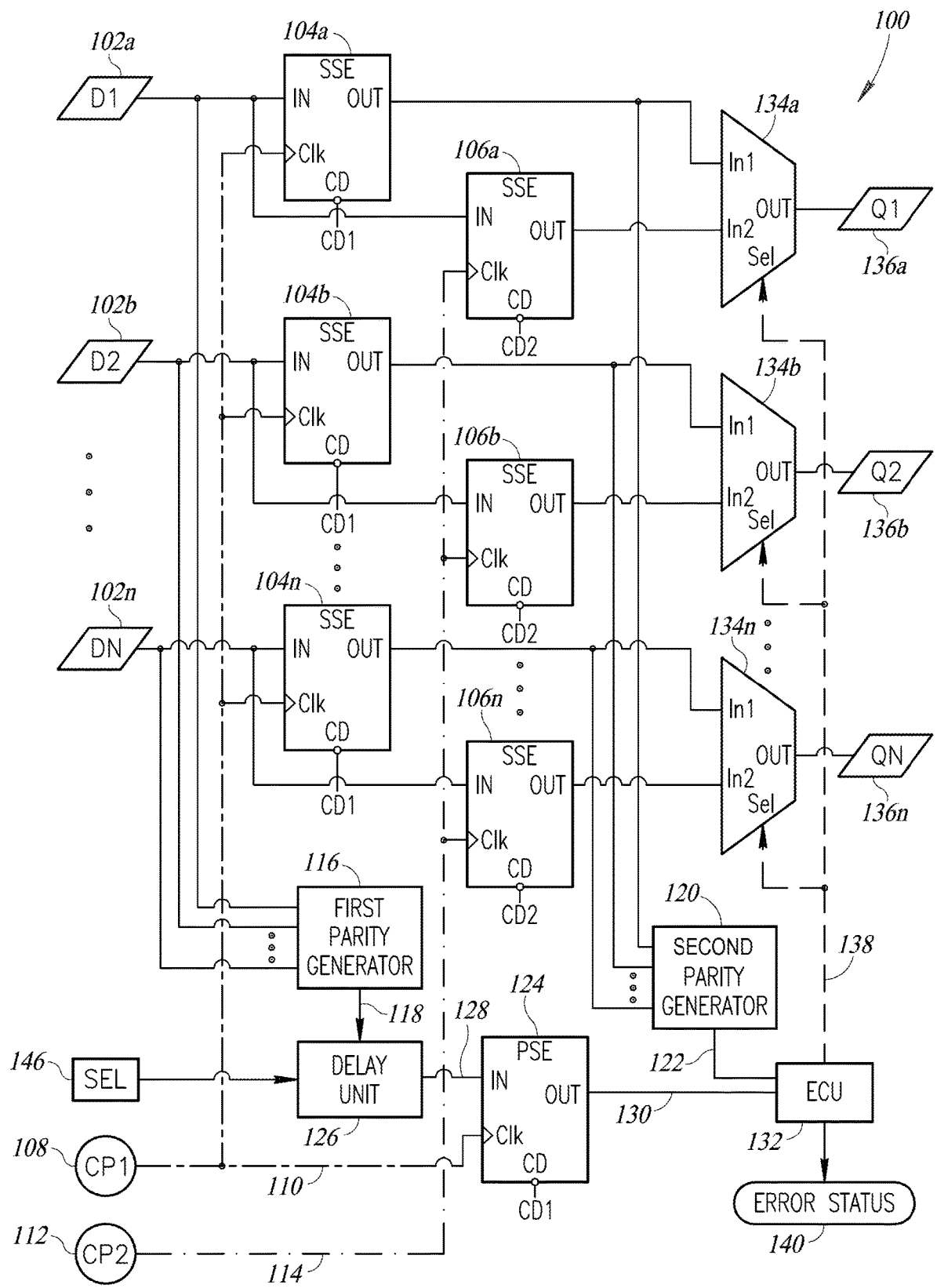
FIG. 1 shows a schematic diagram of a circuit according to one or more embodiments.

FIG. 1 shows a schematic diagram of a robust soft error tolerant multi-bit circuit 100 according to one or more embodiments. The circuit 100 is coupled to N data inputs 102a, . . . , 102N (collectively set of data inputs 102) respectively corresponding to individual bits of data, where N is a non-zero integer. The circuit 100 is configured to store data from the data inputs 102a, . . . , 102N to a set of storage elements. The circuit 100 comprises a first set of storage elements 104a, . . . , 104N (collectively first set of storage elements 104) having inputs respectively coupled to corresponding individual data inputs of the data inputs 102a, . . . , 102N and a second set of storage elements 106a, . . . , 106N (collectively second set of storage elements 106) having inputs also respectively coupled to corresponding individual data inputs of the data inputs 102a, . . . , 102N. The storage elements of the second set of storage elements 106 are redundant to the storage elements of the first set of storage elements 104.

The first set of storage elements 104 are a set of D flip flops having data inputs coupled to the set of data inputs 102. The second set of storage elements 106, in some embodiments, are also D flip flops having data inputs coupled to the set of data inputs 102. In some embodiments, however, the second set of storage elements 106 may be D latches.

The circuit 100 further includes a first clock signal generator 108 that generates a first clock signal 110 and includes a second clock signal generator 112 that generates a second clock signal 114. The first set of storage elements 104 have clock signal inputs (CLK) that receive the first clock signal 110 from the first clock signal generator 108. The first set of storage elements 104 obtain data from the set of data inputs 102 in response to one or more defined clock events of the first clock signal 110, such as a rising edge or a falling edge. The second set of storage elements 106 has clock signal inputs (CLK) that receive the second clock signal 114 from the second clock generator 112. The second set of storage elements 106 obtain data from the set of inputs 102 in response to one or more defined clock events of the second clock signal 114.

The first clock signal 110 has a different timing than the second clock signal 114. For instance, the first clock generator 108 may be configured to generate the defined clock event(s) in the first clock signal 110 periodically at first times and the second clock generator 112 may be configured to generate the defined clock event(s) in the second clock signal 114 periodically at second times. The first clock signal 110 and the second clock signals 114 may have the same clock event frequency, but the defined clock events in the first clock signal 110 may be offset or skewed in time from the defined clock events in the second clock signal 114. In some embodiments, a frequency of defined clock events in the first clock signal 110 may be different than a frequency of defined clock events in the second clock signal 114.

The circuit 100 also includes a first parity generator 116 that generates a first parity check 118 based on logic states of the set of data inputs 102. The first parity generator 116 is a combinational logic circuit having a set of parity inputs coupled to the set of inputs 102 and which generates a logic state based on the number of logic '1' states of the set of data inputs 102. In some embodiments, the first parity generator 116 may be an odd parity generator that generates a logic '1' as the first parity check 118 as a result of the number of logic '1' states of the data inputs 102 being odd. In some embodiments, the first parity generator 116 may be an even parity generator that generates a logic '1' as the first parity check 118 as a result of the number of logic '1' states of the data inputs 102 being even.

The circuit 100 also includes a second parity generator 120 that generates a second parity check 122 based on logic states of the outputs of the first set of storage elements 104. The second parity generator 120 has a set of parity inputs coupled to outputs of the first set of storage elements 104 and which generates a logic state based on the number of logic '1' states of the outputs of the first set of storage elements 104. In some embodiments, the second parity generator 120 may be an odd parity generator that generates a logic '1' as the second parity check 122 as a result of the number of logic '1' states of the outputs of the first set of storage elements 104 being odd. In some embodiments, the second parity generator 120 may be an even parity generator that generates a logic '1' for the second parity check 122 as a result of the number of logic '1' states of the outputs of the first set of storage elements 104 being even.

In some embodiments, the first parity check 118 and the second parity check 122 indicate parity of the same category—that is, whether the parity of the logic states provided thereto are even or odd. For instance, in some embodiments, the first parity generator 116 and the second parity generator 120 may both be odd parity generators that indicate whether the number of logic state '1' provided as input thereto is odd in number. Thus, the first parity check 118 and the second parity check 122 may indicate whether the number of logic state '1' provided as inputs to the first parity generator 116 and the second parity generator 120 is odd in number. In some embodiments, the first parity generator 116 and the second parity generator 120 may both be even parity generators that indicate whether the number of logic state '1' provided as input thereto is even in number. In such embodiments, the first parity check 118 and the second parity check 122 may indicate whether the number of logic state '1' provided as inputs to the first parity generator 116 and the second parity generator 120 is even in number. Those of ordinary skill in the art will appreciate that minor modifications could be made to the circuit 100 to achieve similar effects; for example, one of the first parity generator 116 and the second parity generator 120 may be an odd parity generator, and the other may be an even parity generator, and an output of one of the parity generators may be connected to a logical inverter.

The circuit 100 also includes a parity storage element 124 (PSE) that obtains a time delayed parity check 128 in response to receiving a defined clock event on the first clock signal 110 (e.g., rising edge, falling edge). In particular, a delay unit 126 receives, at a first time, the first parity check 118 from the first parity generator 116 indicating parity of the set of data inputs 102. The delay unit 126 provides the time delayed 128 at a second time after the first time, which is equal in time to the first time plus a time delay period provided by the delay unit 126. The time delayed signal 128 is equivalent to a logic state of the first parity check 118, but delayed in time by the time delay period.

The delay unit 126 is used to set a timing window in which the circuit 100 can detect errors due to radiation (e.g., SEU, SET) or due to a systematic error in the circuit 100 (e.g., power characteristics), as described herein. The delay unit may be implemented using one or more buffers (e.g., digital buffers), one or more pairs of inverters, one or more digital delay elements, or other such logic gates known to those in the art. As discussed in further detail below, the delay unit 126, in some embodiments, may be programmable or reconfigurable to adjust a timing window for detecting errors due to radiation or systematic causes.

The time delayed signal 128 corresponds to a previous parity state of the set of data inputs 102 at the first time, and which is sampled or obtained by the parity storage element 124 at the second time after the first time. The second parity generator 120 also generates the second parity check 122 at the second time.

An error correction unit 132 (ECU) is coupled to the output of the second parity generator 120 and the output of the parity storage element 124, and configured to operate the circuit 100 based on the delayed first parity check 130 and the second parity check 122. The error correction unit 132 performs a comparison between the delayed first parity check 130 and the second parity check 122 and, as a result of the comparison, may cause the circuit 100 to perform one or more operations. The error correction unit 132 includes a collection of logic circuitry (e.g., logic gates, transistors) that are arranged to cause operations to be performed as described herein. In some embodiments, the error correction unit 132 may include one or more XOR gates having inputs coupled to the parity storage element 124 and the second parity generator 120. The error correction unit 132 may include additional logic circuitry (e.g., OR gates) and/or digital circuitry (e.g., adders, registers) that facilitate performance of the operations described herein.

The circuit 100 may include output selection units 134a, 134b, . . . , 134N (collectively set of output selection units 134) for selecting, as a set of outputs 136a, 136b, . . . 136N (collectively set of outputs 136) of the circuit 100, an output of a corresponding output of the first set of storage elements 104 and the second set of storage elements 106. Each selection unit of the set of output selection units 134 corresponds to a different bit of data to be outputted from the circuit 100. Each output selection unit of the set of output selection units 134 has a first input In1 coupled to an output of a corresponding one of the first set of storage elements 104 and a second input In2 coupled to an output of a corresponding one of the second set of storage elements 106. Each output selection unit provides, as output data to the set of outputs 136, data received at a selected one of the first input In1 and second input In2. For instance, a first input In1 of an output selection unit 134a is coupled to an output of storage element 104a and a second input In2 of the output selection unit 134a is coupled to an output of storage element 106a.

Each of the set of output selection units 134 includes a selection input Sel electrically communicatively coupled to an output of the error correction unit 132. The set of output selection units 134 respectively provides output data to the set of outputs 136 based on a signal received at the selection input Sel. The error correction unit 132 provides a selection signal 138 to the set of output selection units 134 that causes the set of output selection units 134 to provide data received at the selected one of the first input In1 or the second input In2 based on the selection signal 138 received. In some embodiments, the selection signal 138 provided by the error correction unit 132 may be a digital signal having a discrete set of logic states or values (e.g., logic state '0', logic state '1'). For instance, the error correction unit 132 may provide a selection signal 138 having a logic state '0', which may cause the set of output selection units 134 to provide data from the first inputs In1 to the set of outputs 136. The error correction unit 132 may provide a selection signal 138 having a logic state '1', which may cause the set of output selection units 134 to provide data from the second inputs In2 to the set of outputs 136.

The set of output selection units 134 may be implemented using multiplexers in some embodiments. However, those of ordinary skill in the art will appreciate that circuitry for selecting output among a set of inputs may be implemented according to other logit gate or transistor transistors.

The error correction unit 132 may perform a comparison between the second parity check 122 and the delayed first parity check 130, and provide the selection signal 138 as a result of the comparison. In particular, the error correction unit 132 compares the value of the second parity check 122 and the value of the delayed first parity check 130 and provides a selection signal 138 having a first value (e.g., logic state '0') as a result of determining that the values match. The first value corresponds to a determination by the error correction unit 132 that an error due to radiation or a systematic causes in the circuit 100 has not occurred in the circuit 100 during a time window, as described herein. Providing the first value for the selection signal 138 may cause the set of output selection units 134 to select data from the first inputs In1 as the data to be provided to the set of outputs 136.

Conversely, if the value of the second parity check 122 does not match the value of the delayed first parity check 130, the error correction unit 132 may provide a selection signal 138 having a second value (e.g., logic state '1'). The second value corresponds to a determination by the error correction unit 132 that an error due to radiation or systematic causes has occurred in the circuit 100 during the timing window.

The error correction unit 132 may also generate an error status 140 based on a result of the comparison between the values of the second parity check 122 and the delayed first parity check 130. The error status 140 may indicate whether the occurrence of an error was due to an SEU, an SET, or operational characteristics of the circuit 100 (e.g., clock signals, power characteristics), as described herein. The error correction unit 132 may perform one or more particular operations in response to the determination of a category for the error (e.g., systematic error, radiation strike). In some instances, the error correction unit 132 may generate an error status 140 indicating a first error condition corresponding to an SEU resulting from a radiation strike. The error correction unit 132 may generate an error status 140 indicating a second error condition corresponding to an SET resulting from a radiation strike. The error correction unit 132 may generate an error status 140 indicating a third error condition corresponding to a systematic error, such as power characteristics of power being applied to elements of the circuit 100. The error conditions for the error status 140 may be representative of more specific errors in the circuit 100, such as error due to operating voltage, timing in the circuit 100, etc. In some instances, the error status 140 may indicate that no error conditions are presently detected in connection with the circuit 100. The error status 140 may be represented as a set of logic states of the circuit 100.

The delay unit 126 provides a timing delay between a time at which the first parity generator 116 outputs the first parity check 118 and a time at which the parity storage element 124 receives the time delayed signal 128. The time delay provided by the delay unit 126, in some embodiments, may be selectively adjustable using a delay input 142 of the delay unit 126. The delay unit 126 may automatically reconfigure itself to adjust a number and/or type of logic gates, buffers, inverters, etc., provided between an input and an output of the delay unit 126. The delay unit 126, in at least some embodiments, does not affect the logic state of the first parity check 118 received at an input thereof. The time delay provided by the delay unit 126 may be adjusted to change the timing window for the circuit 100, which is equal to sum of the time delay of the first parity generator 116 and the time delay of the delay unit 126. The delay input 142 may receive a digital signal whose value corresponds to one of a plurality of selectable time delays. The delay unit 126 may include a set of hardware registers that are adjustable according to the delay input 142 received.

The parity storage element 124 samples or obtains data of time delayed signal 128 according to the first clock signal 110. For example, the first parity generator 116 receives data corresponding logic states of the set of data inputs 102 at a first time and generates the first parity check 118, which is provided as an output to the first parity generator 116 at a second time. A first delay may be provided by the first parity generator 116 between the first time and the second time.

The circuit 100 has robust protection against SEU due to radiation strike events. In the event that a radiation strike upsets one of the first set of storage elements 104, the difference in parity between the second parity check 122 and the delayed first parity check 130 will cause the error correction unit 132 to provide outputs from the second set of storage elements 106 as the set of outputs 136. In the event that a radiation strike upsets one of the second set of storage elements 106, no difference in parity will be registered and no error would result, so the error correction unit 132 causes the outputs of the first set of storage elements 104 to be provided as the set of outputs 136. If a radiation strike impacts the parity storage element 124, the data sampled for either the first set of storage elements 104 or the second set of storage elements 106 will not be affected, so no data error will result.

The circuit 100 also has robust protection against SET events due to radiation strike events, which could cause a change in data if a glitch occurs close to a defined clock event for sampling data. In the circuit 100, there are multiple sampling points for detecting error introduced due to SET and to fix the error, which is not implemented in previously-implemented designs that detect SEU events. If a sample obtained through the parity storage element 124 path occurs due to SET, the error correction unit 132 may register an error, but the data sampled on the first and second set of storage elements 104 and 106 remains uncorrupted, so the risk of malfunction or failure is low. If data sampled by the first set of storage elements 104, the error will be detected in a timing window TW (see FIG. 2). This error is corrected by providing output from the second set of storage elements 106, which are sampled according to defined clock events of the second clock signal generator 112 that is skewed in time with respect to the first clock signal generator 108 by a clock skew SK (see FIG. 2). Errors due to SET events on the second set of data storage units 106 have no effect on the rest of the circuit 100, so set of outputs 136 would remain unaffected by such errors.

The error correction unit 132 can differentiate between error due to timing and radiation and perform operations in response to the type of error detected. Errors due to radiation events (e.g., SEUs, SETs) may occur rarely, so such errors may be corrected at least in part by causing the set of output selection units 134 to provide data from the second set of storage elements 106 to the set of outputs 136. By contrast, timing errors may occur when data is changing clock to a defined clock event or clock edge, which appear periodically. The error correction unit 132 may monitor the parity over numerous clock cycles and perform a remediation action in response to detecting a number of errors exceeding a defined threshold for the error correction unit 132. Error signals may be provided to logic circuitry (e.g., OR gate, adder) to track the number of errors in a given period of time, which may correspond to the error status 140. The error correction unit 132 may be electrically communicatively coupled to another device or system that controls operating conditions of the circuit 100.

A potential issue with the circuits is that the occurrence of SETs on clock signal lines can adversely impact the circuit by causing glitches on the clock signals if the clock signal nodes have low capacitance. Some clock trees have high capacitances and therefore the critical charge required to cause a glitch is also very high. Such high capacitance clock trees have robust tolerance to SET events. However, in some circumstances, it may be desirable to implement clock tree networks having lower capacitance nodes, for example, to reduce an area of the circuit. Therefore, the circuit 100 may include glitch filters connected to clock signal inputs Clk of each of the first set of storage elements 104.

Figure 5:
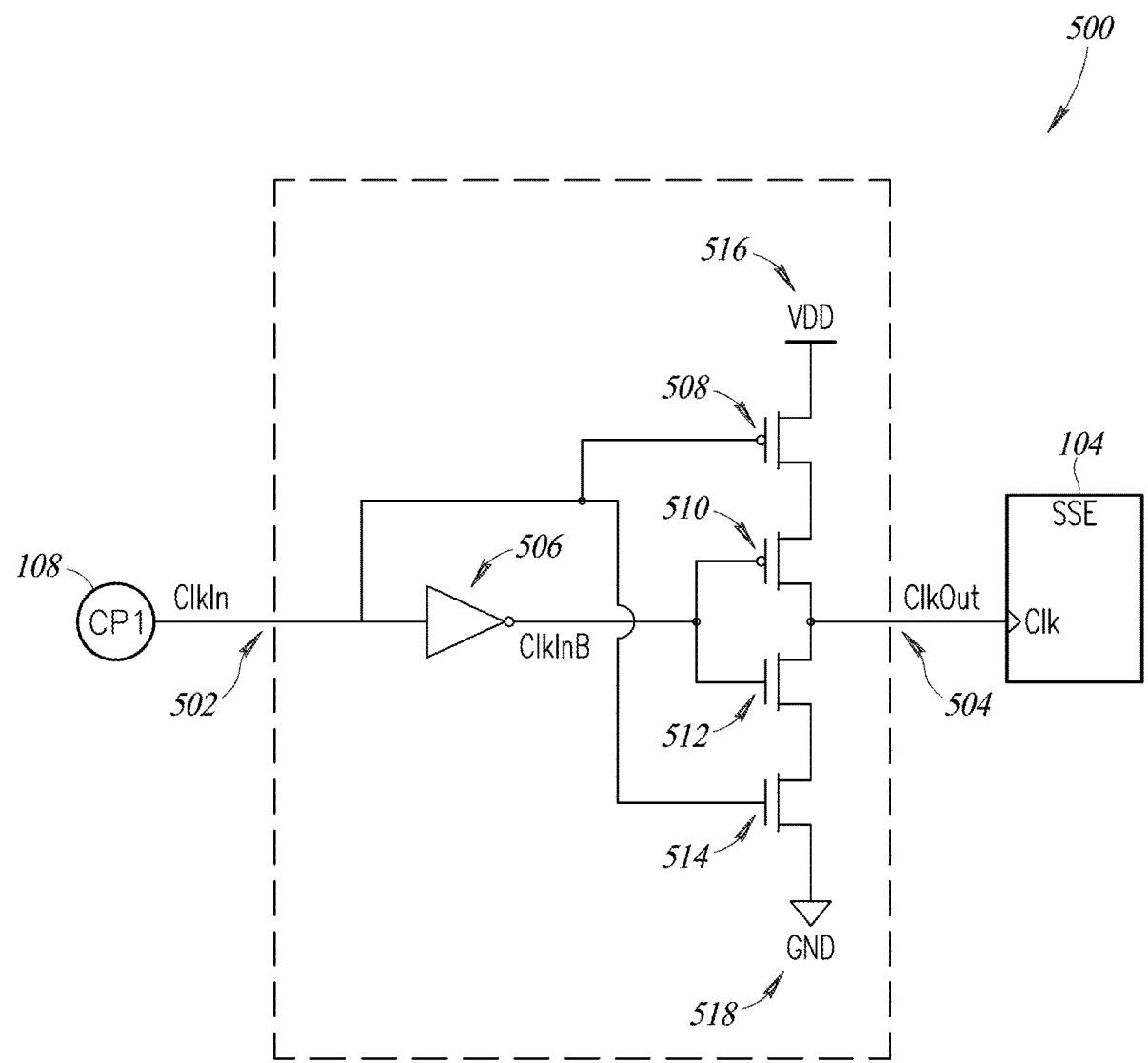
FIG. 5 shows a glitch filter connected to a storage element of the circuit of FIG. 1.

FIG. 5 shows a schematic diagram of a glitch filter 500 that, in some embodiments, may be coupled to the clock inputs of individual storage elements of the first set of storage elements 104. The glitch filter 500 may eliminate a clock signal transition caused by an SET event. The glitch filter 500 has a first terminal 502 for receiving a clock signal ClkIn from the first clock signal generator 108. A second terminal 504 of the glitch filter 500 is connected directly to a clock signal input of one of the first set of storage elements 104. The glitch filter 500 further includes a buffer 506 and a set of transistors coupled in series between a voltage supply 516 and a ground 518. The an input of the buffer 506 receives the clock signal ClkIn from the first terminal 502 and generates a complementary clock signal ClkInB that is inverted with respect to the clock signal ClkIn.

The set of transistors includes a first transistor 508 and a second transistor 510 that are both transistors of the same type (e.g., n-type MOSFET transistors). The set of transistors also includes a third transistor 512 and a fourth transistor 514 that are of the same type (e.g., p-type MOSFET transistors) that is different from the transistor type of the first transistor 508 and the second transistor 510. A gate of the first transistor 508 and a gate of the fourth transistor 514 are each coupled to the first terminal 502 to receive the clock signal ClkIn. A gate of the second transistor 510 and a gate of the third transistor 512 are each coupled to the output of the buffer 506 to receive the complementary clock signal ClkInB.

A first terminal of the first transistor 508 is coupled to the voltage supply 516 and the second transistor 510 is coupled in series to the second terminal of the first transistor 508. A second terminal of the fourth transistor 514 is coupled to the ground 518 and the third transistor 512 is connected in series to the first terminal of the fourth transistor 514. The second transistor 510 and the third transistor 512 are connected in series with each other. A clock signal output ClkOut is provided to the second terminal 504 of the glitch filter 500 from a node between terminals of the series connected second transistor 510 and the third transistor 512.

The glitch filter 500 facilitates elimination of transient signals (e.g., unwanted pulses) on the clock signal inputs to the first set of storage elements 104. The glitch filter 500 shown and described is one non-limiting example of how the glitch filter 500 may be implemented. There are other circuit designs for eliminating unwanted transient signals from being injected onto the clock signal inputs to the first set of storage elements 104 without departing from the scope of the present disclosure. Due to the redundancy provided by the second set of storage elements 106 operating according to a different clock signal, glitch filters 500 are not needed for the clock signal inputs of the second set of storage elements 106, thereby reducing the area that would otherwise be consumed by such filters. In some previously-implemented designs, such as TMR designs, solutions for filtering transient signals would have to be provided to each storage element thereof.

Each storage element of the first set of storage elements 104, the second set of storage elements 106, and the parity storage element 124 may include a clear input CD for driving the respective storage elements to a reset state (e.g., Q=0). The occurrence of a SET on a path to the clear inputs CD could result in a localized resetting of the storage elements due to the fact that a reset buffer tree may have low capacitance points with less charge. To avoid this potential issue, separate reset paths may be provided to separate sets of storage elements. In particular, a first reset path CD1 is provided for sending a reset signal to the first set of storage elements 104 and the parity storage element 124. A second reset path CD2 is provided for sending the reset signal to the second set of storage elements 106. The same reset signal is provided over the first reset path CD1 and the second reset path CD2, but the buffer tree for the first reset path CD1 is different than the buffer tree for the second reset path CD2.

In the event that an SET event occurs on the first reset path CD1, the error correction unit 132 will register an error due to detection of a difference between the delayed first parity check 122 and the second parity check 130. Thus, the error correction unit 132 can correct error even if an SET event occurs in the first reset path CD1. On the other hand, if an SET event occurs on the second reset path CD2, the outputs of the first set of storage elements 104 are unaffected, so the SET event will not impact fidelity of the data output from the set of data outputs 136.

In some embodiments, glitch filters may be installed at the clear inputs CD of each storage element instead of implementing the separate first reset path CD1 and the second reset path CD2. However, this solution would consume a large area to implement, thus reducing the density of the circuit 100.

Figure 2:
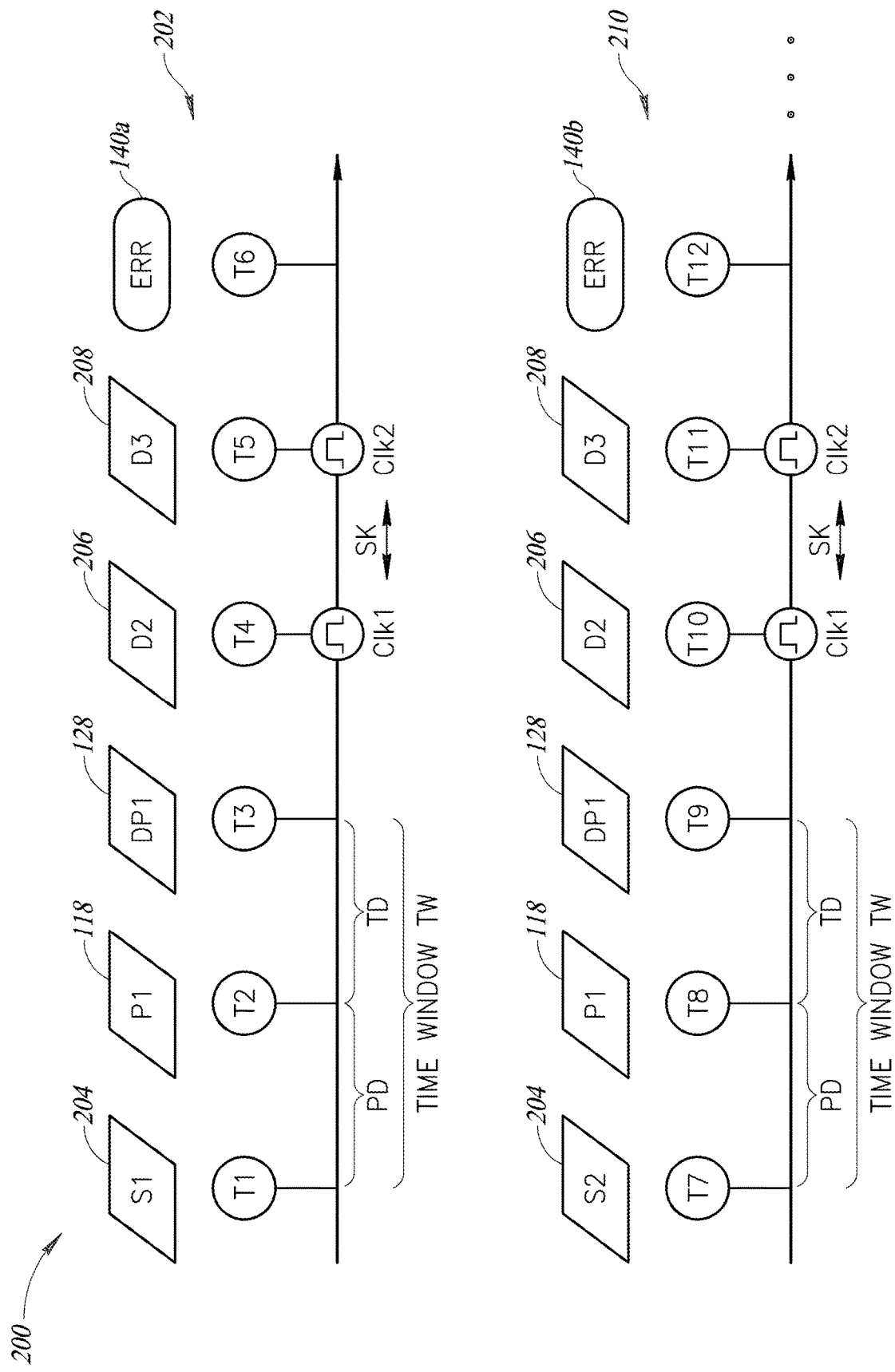
FIG. 2 shows a timing diagram for events occurring in the circuit of FIG. 1.

FIG. 2 shows a timing diagram 200 illustrating events occurring in connection with the circuit 100 according to one or more embodiments. At a first time T1 in a first time period 202, a first set of data 204 is provided on the set of data inputs 102 and obtained by the first parity generator 116. At time T2 in the first time period 202, the first parity generator 116 generates the first parity check 118. A parity delay PD corresponding to a delay in time exists between the first time T1 and the second time T2 as a result of the processing involving the performed by the first parity generator 116. The delay unit 126 provides a time delay TD between the second time T2 and a third time T3 at which the delay unit 126 outputs the time delayed signal 128. The parity delay PD and the time delay TD collectively comprise a time window TW of the circuit 100 for detecting errors, as described herein.

At a time T4, the first clock signal generator 108 generates a first defined clock event Clk1 on the first clock signal 110. The first defined clock event Clk1 may be a rising edge or falling edge of the first clock signal 110 depending on a configuration of the elements of the circuit 100. The defined clock event Clk1 causes the first set of storage elements 104 to sample data present on the set of data inputs 102 at the time T4 to obtain a second set of data 206 from the set of data inputs 102. The defined clock event Clk1 also causes the parity storage element 124 two sample the time delayed signal 128 at the time T4.

At a time T5, the second clock signal generator 112 generates a second defined clock event Clk2 on the second clock signal 114. The second defined clock event Clk2 may be rising edge or falling edge of the second clock signal 114 depending on the configuration of the elements of the circuit 100. The second defined clock event Clk2 causes the second set of storage elements 106 to sample data present on the set of data inputs at the time T5.

The time period between the time T4 and the time T5 defines a clock skew SK between the first clock signal generator 108 and the second clock signal generator 112. In some embodiments, for example, the first clock signal generator 108 and the second clock signal generator 112 may respectively generate first defined clock events Clk1 and second defined clock events Clk2 at the same frequency. However, the second defined clock events Clk2 may be offset in time from the first defined clock events Clk1 by a particular period of time corresponding to the clock skew SK of the circuit 100. The clock skew SK is a variable quantity that may be selected depending on the margin of safety desired by a designer. A minimum value for the clock skew SK may be calculated based on duration of pulse caused by radiation strike affecting combinational path of the circuit 100. The clock skew SK should be more than a worst-case pulse duration scenario such that the SET fault can be avoided. The clock skew SK facilitates sampling of multiple windows for the set of data inputs 102 so that in the circuit 100 are not overlooked.

At a time T6, the error correction unit 132 receives the second parity check 122 from the second parity generator 120 and receives the delayed first parity check 130 from the parity storage element 124. The error correction unit 132 then performs a comparison between the second parity check 122 and the delayed first parity check 130 and determines the error status 140a for the first time period 202 based on a result of the comparison.

The configuration of the circuit 100 facilitates the error correction unit 132 to detect whether an SET event occurred during the timing window TW. In particular, the error correction unit 132 performs a comparison between the delayed first parity check 130 for the first set of data D1 from the first time T1 and the second parity check 122 for the second set of data D2 sampled at the fourth time T4. The error correction unit 132 determines the error status 140a based on a result of the comparison between the parity checks. If the parity checks 122 and 130 do not match, the status 140a generated corresponds to an error condition for the circuit 100. If, on the other hand, the parity checks 122 and 130 match each other, the error correction unit 132 may determine that no error condition is present in the circuit 100 for the first time period 202. As a result of determining that an error condition is present in the circuit 100 for the first time period 202, the error correction unit 132 may cause one or more remedial actions to be performed to correct or otherwise remedy the error condition. For instance, the error correction unit 132 may cause the output selection units 134 two output the third set of data 208 sampled at the time T5 instead of the second set of data 206 sampled at the time T4.

In some embodiments, the error correction unit 132 may cause one or more remedial actions to be performed based on results of a plurality of timing windows TW. The error correction unit 132 may determine an error status for a second time period 210 subsequent to the first time period 202. The second time period 210 includes time T7 through time T12 each respectively corresponding to time T1 through time T6 of the first time period 202. The first defined clock event Clk1 of the second time period 210 occurs at a defined interval after the first defined clock event Clk1 of the first time period 202 according to the clock rate of the first clock signal generator 108. Similarly, the second defined clock event Clk2 of the second time period 210 occurs a defined interval after the first defined clock event Clk1 of the first time period according to the clock rate of the second clock signal generator 112. In some embodiments, the first clock signal generator 108 and the second clock signal generator 112 may have a same clock rate but be offset in time by the clock skew SK.

The error correction unit 132 may consider error conditions for more than one time period in connection with determining an error status for a time period. For instance, the error correction unit 132 may determine that an error corresponding to an SET event has occurred based on an error condition being detected in a current time period and a previous time period, such as an immediately preceding time period or within a time period that is less than a defined threshold time period. For instance, as a result of determining that the first parity check 118 does not match the delayed first parity check 130 for the second time period 210, the error correction unit 132 may generate an error condition for an error status 140b for the second time period 210. The error correction unit 132 may determine that the error condition for the second time period 140b corresponds to an SET event or a timing error in the circuit 100 based on the detection of error conditions in consecutive time periods.

The error correction unit 132 may cause a different or an additional remedial action to be performed as a result of detecting the error condition for the second time period to 10 in addition to detecting error condition for the first time period 202. The remedial action for the second time period 210 may include adjusting operational parameters of the circuit 100. As one example, the error correction unit 132 may adjust power characteristics of power supplied to circuit elements of the circuit 100, such as a voltage level applied to the first set of storage elements 104 and/or the second set of storage elements 106. As another example, the error correction unit 132 may adjust the clock rate of the first clock signal generator 108, the clock rate of the second clock signal generator 112, and/or the clock skew SK.

In some embodiments, the error correction unit 132 may determine the error status 140 based on an error rate detected in the clock circuit, such as the number of error conditions detected within a given time period that includes a plurality of clock cycles of one of the first clock signal generator 108 or the second clock signal generator 112. The error correction unit 132 may include memory or a set of hardware registers that define a number of errors detected that, if exceeded in a given number of clock cycles, cause the error correction unit 132 to determine a corresponding error condition for the error status 140. Although only two time periods are depicted in discussed with respect to FIG. 2, there may be an indefinite number of time periods in which the error correction unit 132 evaluates operation of the circuit 100.

Figure 3:
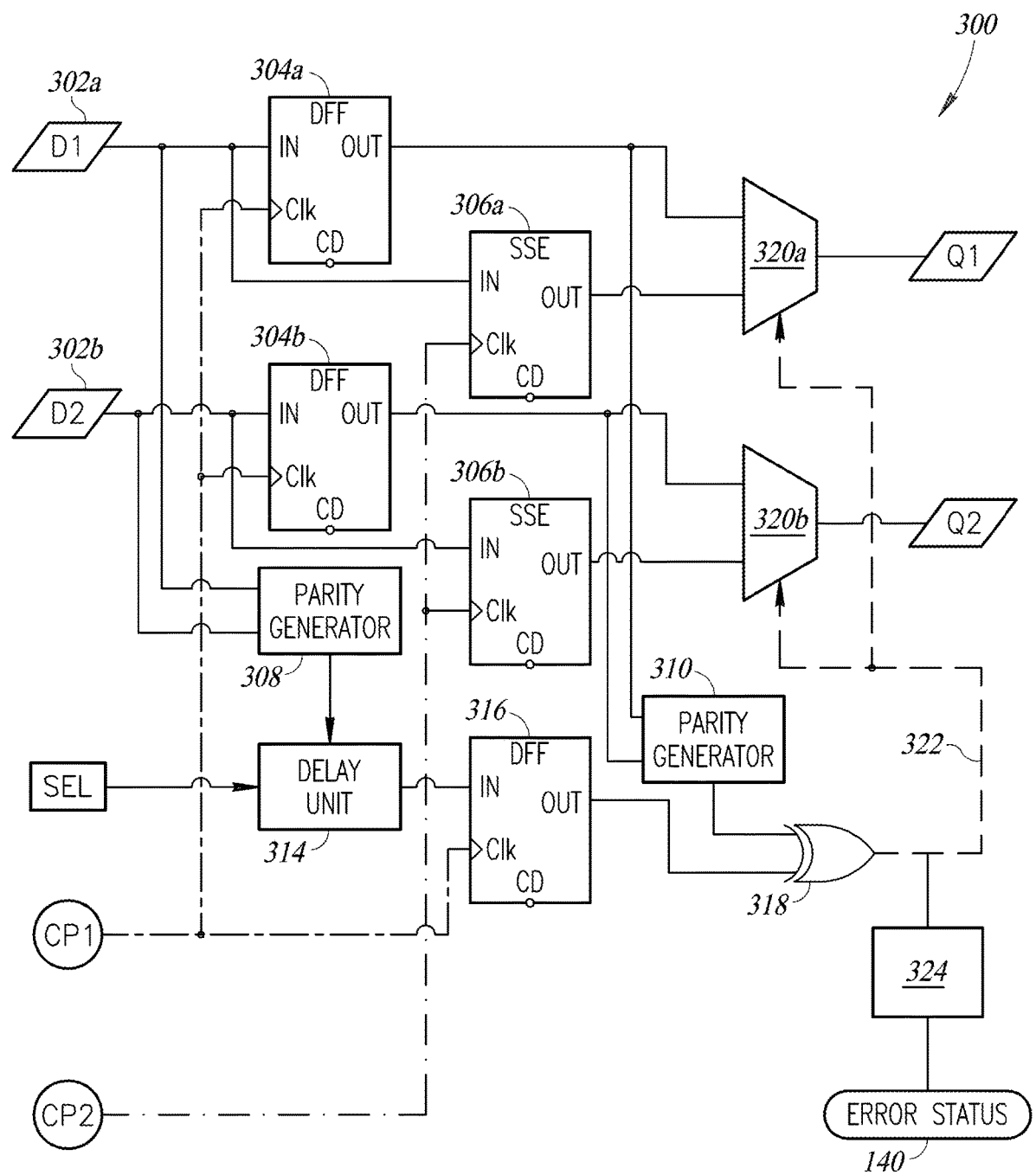
FIG. 3 shows a second schematic diagram of an implementation of the circuit of FIG. 1.

FIG. 3 shows a circuit 300 corresponding to a two-bit implementation of the circuit 100 according to one or more embodiments. The circuit 300 corresponds to a two-bit implementation of the circuit 100. The circuit 300 includes a first data input 302a corresponding to a first bit of data and a second data input 302b corresponding to a second bit of data. The first data input 302a and the second data input 302b are collectively referred to as a set of data inputs 302. The first data input 302a and the second input 302b are respectively coupled to a data input line of the first D flip-flop 304a and the second D flip-flop 304B. The first data input 302a and the second data input 302b are also respectively coupled to a data input line of a first storage element 306a and a second storage element 306b. The first storage element 306a and the second storage element 306b, in some embodiments are D flip-flops. However, in some embodiments, the first storage element 306a and the second storage element 306b may be D latches.

The first data input 302a and the second data input 302b are coupled to inputs of the first parity generator 308. The first parity generator 308 may be a two-input XOR gate in at least some embodiments. Outputs of the pair of D flip-flops 304 are coupled to a second parity generator 310, which is also a two-input XOR gate in some embodiments. In some embodiments the first parity generator 308 and the second parity generator 310 may correspond to other logic gates or combinations of various logic gates or circuits, such as an XNOR gate having an output coupled to an inverter.

The output of the first parity generator 308 is delayed in time by a delay unit 314, which delays the parity check from the first parity generator 308 by a defined time delay, as described herein. The delayed parity output from the first delay unit 314 is provided to a D flip flop 316, which corresponds to the parity storage element 124 of FIG. 1 and which provides a time delayed parity check as an output to an error correction unit 318.

The error correction unit 318 receives the time delayed parity check from the D flip flop 316 and the output of the second parity generator 310. The error correction unit 318 is a two-input XOR gate, but may be implemented as other logic gates or combinations of logic gates in some embodiments—for instance, as an XNOR gate having an inverted output. As a result of a comparison between the time delayed parity check from the D flip flop 316 and the output of the second parity generator 310, the error correction unit 318 may output a signal 322 that causes output selection units 320 to selectively output data. The error correction unit 320 may output a signal 322 that causes the output selection units 322 output data from the first pair of storage elements 204 as a result of not detecting an error in the parity checks (e.g., parity checks match). The error correction unit 320 may output a signal 322 that causes the output selection units 320 to output data from the second pair of storage elements 206 as a result of detecting an error in the parity checks (e.g., parity checks do not match). The configuration and operation of the circuit 300 facilitates prevention of malfunction or faulty output due to SET events. For instance, failures or malfunction of the circuit 300 due to SET events are avoided due to multiple sampling windows.

The circuit 300 may include additional circuitry 324 representative of a state of the circuit 200 over time. For instance, the additional circuitry 324 may be an adder having an output representative of an error condition of a current time period and one or more error conditions of one or more previous time periods. For instance, the circuitry 324 may add a logic state '1' representative of a presence of an error condition for a current time period to a sum-output representative of error conditions for a set of immediately preceding time periods. The circuitry 324 may include comparative circuitry that compares the output-sum of the adder to determine whether a plurality of error conditions have occurred within a given time period. If so, the circuitry 324 may generate a signal which causes one or more remedial actions to occur, such as adjusting the operating characteristics of the circuit 300.

Various aspects of the circuit 300 depicted are similar or identical to the circuit 100, so further description thereof is omitted for brevity.

Figure 4:
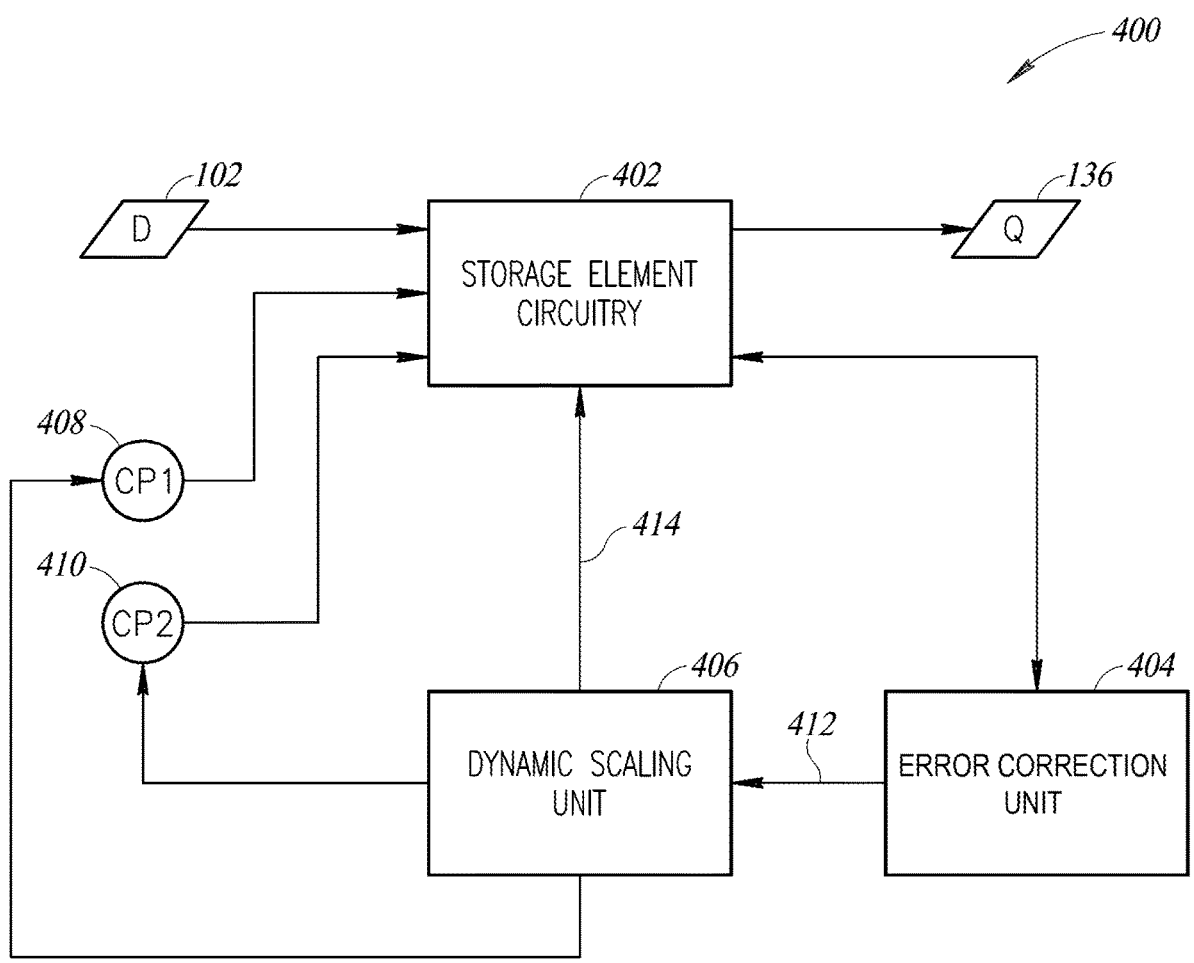
FIG. 4 shows a system according to one or more embodiments.

FIG. 4 shows a system 400 including storage element circuitry 402, an error correction unit 404, a dynamic scaling unit 406, a first clock signal generator 408, and a second clock signal generator 410. The storage element circuitry 402 corresponds to the storage elements, parity generators, output selection units, and delay unit described with respect to the circuit 100. For instance, the storage element circuitry 402 may provide the first parity check 118 and the delayed first parity check 132 the error correction unit 404 for evaluation. The error correction unit 404 is a collection of logic circuitry that performs as described with respect to the error correction unit(s) described herein.

The dynamic scaling unit 406 controls various operational characteristics of the storage element circuitry 402, such as operating voltage (e.g., level, frequency) powering elements of the storage element circuitry 402, such as the storage elements, parity generators, etc. The dynamic scaling unit 406 may also control the occurrence of defined clock events of the first clock signal generator 408 and/or the second clock signal generator 410, such as by controlling the clock rate of one or both of the clock signal generators 408 and 410, or by controlling a clock skew SK between defined clock events of the clock signal generators.

The error correction unit 404, as a result of detecting particular errors in the storage element circuitry 402, may adjust timings of the first clock signal generator 408 and the second clock signal generator 410, or may adjust operating parameters of the storage element circuitry 402 to correct the errors and prevent future instances thereof. The error correction unit 404 may also cause output selection units of the storage element circuitry 402 to output data from certain sets of storage elements of the storage element circuitry 402 based on whether occurrences of errors are detected in the storage element circuitry 402.

The error correction unit 404 may detect that an error condition corresponding to a radiation strike (e.g., SEU, SET) has occurred for a given time period and send the selection signal 138 to the set of output selection units 134 (see FIG. 1) for outputting data sampled on a particular set of storage elements (e.g., second set of storage elements 106). The error correction unit 404 may detect the occurrence of systematic error conditions due to operating characteristics of the storage element circuitry 402, such as timing errors. Timing errors may manifest as the periodic occurrence of errors in a plurality of subsequent or sequential time periods. The error correction unit 404 may send signals 412 to the dynamic scaling unit 406 that cause the scaling unit to adjust operating characteristics of the storage element circuitry 402 to remedy such systematic errors.

In response to receiving the signal(s) 412 from the error correction unit 404, the dynamic scaling unit 406 may adjust timing characteristics or power characteristics of the storage element circuitry 402. Adjustment of timing characteristics may include causing one or both of the first clock signal generator 408 and the second clock signal generator 410 to provide the defined clock signal events Clk1 and Clk2 at a different frequency. Adjustment of timing characteristics may include causing a modification to the clock skew SK between the defined clock signal events Clk1 and Clk2. The timing characteristics may be adjusted based on a detected error rate for the storage element circuitry 402. The error correction unit 404 may provide the signals 412 causing the dynamic scaling unit 406 to adjust the timing characteristics of the storage element circuitry 402 until the error rate exhibited is below a defined threshold.

Adjustment of the power characteristics of the storage element circuitry 402 may include adjusting, by the dynamic scaling unit 406, a voltage level or a current level applied to the storage element circuitry 402. For instance, the signal(s) 412 may cause the dynamic scaling unit 406 to increase the DCD voltage of power 414 supplied to the storage element circuitry 402. The power 414 may be supplied by another power source to the dynamic scaling unit 406, which regulates the power 414 to the storage element circuitry 402 in some embodiments. The dynamic scaling unit 406 may, in some embodiments, cause a power supply directly powering the storage element circuitry 402 to adjust the power 414 supplied. In some instances, the signal(s) 412 may cause the dynamic scaling unit 406 to adjust both the timing and power characteristics for the storage element circuitry 402 in concert, such as by increasing both the clock rate and the voltage level.

The error correction unit 404 may be configured to perform operations to operate at lower power characteristics while maintaining the same level of speed or performance. The error correction unit 404 may, during a first time period, control the dynamic scaling unit 406 to operate the storage element circuitry 402 in a state in which the storage element circuitry 402 is operating in an acceptable mode—that is, not exhibiting systematic errors (e.g., timing errors). The error correction unit 404 may, during a second time period after the first time period, control the dynamic scaling unit 406 to iteratively reduce the power characteristics and the timing characteristics until the storage element circuitry 402 begins exhibiting systematic errors—for instance, by reducing clock rate and voltage until the storage element circuitry 402 begins exhibiting timing errors. During a third time period, the error correction unit 404 may then control the dynamic scaling unit 406 to iteratively increase the clock rate while maintaining the current voltage level until the storage element circuitry 402 begins operating in a normal mode—that is, a mode in which the error rate is below a defined threshold. This procedure allows the error correction unit 404 to cause the storage element circuitry 402 to operate in a reduced power mode while also facilitating the storage element circuitry 402 to operate at an acceptable level.

Elements of the system 400 may be incorporated into a system-on-chip design in which the constituent elements are all formed in the same integrated circuit. For instance, two or more of the storage element circuitry 402, the error correction unit 404, the dynamic scaling unit 406, the first clock signal generator 408, and the second clock signal generator 410 may be included in the same integrated circuit. In some embodiments, two or more of the storage element circuitry 402, the error correction unit 404, the dynamic scaling unit 406 may be incorporated into the same integrated circuit, which receives power and clock signals from external sources. In some embodiments, such an integrated circuit may receive a single clock signal, and the integrated circuit may be provided with additional delay circuitry for providing a second clock signal that has a clock skew SK relative to the single clock signal received. In some embodiments, the system 400 may be implemented as a set of two or more distinct circuits (e.g., logic gates, integrated circuits).

The technology described herein may operate under reduced power (relative to previously-implemented solutions), operates with complete robustness against radiation as well as aging, and can operate with comparable performance to previously-implemented solutions. Further, this technology is suitable for applications where high robustness to soft errors is required, such as aerospace and medical applications. The solutions discussed herein have a large scope of utility in Application Specific Integrated Circuits, System-on-Chip, or other similar integrated circuit applications.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a set of data inputs;
a first clock having a first clock signal;
a second clock having a second clock signal that is different from the first clock signal;
a first set of storage elements coupled to the set of data inputs and coupled to the first clock;
a second set of storage elements coupled to the set of data inputs and coupled to the second clock;
a first parity generator coupled to the set of data inputs;
a second parity generator coupled to the first set of storage elements;
an error correction unit coupled to the first parity generator and the second parity generator;
a parity storage element; and
a delay unit coupled between the first parity generator and the parity storage element, the delay unit receiving a first parity check generated by the first parity generator, and outputting the first parity check to the parity storage element after a time delay period provided by the delay unit.

2. The device of claim 1, wherein the parity storage element is coupled between the first parity generator and the error correction unit.

3. The device of claim 2, wherein the delay unit selectively adjusts the time delay period based on an input of the delay unit.

4. The device of claim 2, wherein the parity storage element is coupled to the first clock.

5. The device of claim 1, comprising:
a set of output selection units coupled to the first set of storage elements and coupled to the second set of storage elements.

6. The device of claim 5 wherein the set of output selection units output a first output of the first set of storage elements or a second output of the second set of storage elements in response to a signal from the error correction unit.

7. The device of claim 1, wherein each storage element of the first set of storage elements includes a reset input and each storage element of the second set of storage elements includes a reset input, the device comprising:
a first reset path coupled to the reset inputs of the first set of storage elements for providing a reset signal; and
a second reset line connected to the reset inputs of the second set of storage elements for separately providing the reset signal.

8. The device of claim 7:
wherein the parity storage element is coupled between the first parity generator and the error correction unit and has a reset input, and wherein the first reset path is coupled to the reset input of the parity storage element.

9. The device of claim 1, wherein each storage element of the first set of storage elements includes a clock signal input, the device comprising:
a set of glitch filters each having a filter output coupled to the clock signal input of each of the first set of storage elements and each having a filter input coupled to the first clock.

10. A circuit, comprising:
a set of data inputs;
a first set of storage elements that receive first data from the set of data inputs at a set of first defined clock events;

a second set of storage elements that receive second data from the set of data inputs at a set of second defined clock events; and an error correction unit that:
performs a comparison between a time delayed first parity check of input data from the set of data inputs and a second parity check of the first data,
determines an occurrence of an error condition based on a result of the comparison,
controls a power characteristic of at least one set of storage elements of the first set of storage elements and the second set of storage elements based on the error condition determined, and
outputs the first data or the second data based on the comparison.

11. The circuit of claim 10, wherein the error correction unit determines the occurrence of the error condition based on an error rate of the circuit, and controls at least one set of times of the set of first defined clock events and the set of second defined clock events based on the occurrence of the error condition determined.

12. The circuit of claim 10, wherein the error correction unit determines the error condition based on an error rate of the circuit.

13. The circuit of claim 10, comprising:
a first parity check generator that generates a first parity check at a first time based on the input data from the set of data inputs;
a delay unit that receives the first parity check and generates the time delayed first parity check that includes the first parity check delayed in time by a defined time delay; and
a storage element having an input that receives the time delayed first parity check at a second time and provides an output to the error correction unit.

14. The circuit of claim 10, wherein the error correction unit is configured to determine a first error condition corresponding to a systematic error in the circuit as a result of a plurality of differences between the time delayed first parity check and the second parity check, and controls the power characteristic in response to the first error condition determined.

15. The circuit of claim 14, wherein the error correction unit is configured to determine a second error condition corresponding to a single event upset as a result of detection of an isolated difference between the time delayed first parity check and the second parity check.

16. A method of operating a logic circuit, comprising:
receiving, from a first parity generator, a first parity check indicating parity of data sampled at a first time by a first set of storage elements;
outputting, from a delay unit coupled between the first parity generator and a parity storage element, the first parity check after a time delay period provided by the delay unit;
storing, by the parity storage element, the first parity check output by the delay unit;
receiving, from a second parity generator, a second parity check indicating parity of data sampled at a second time subsequent to the first time by the first set of storage elements;
detecting a first difference between the first parity check and the second parity check;
determining, as a result of detecting the first difference, an occurrence of a single event effect in the logic circuit; and
outputting the data sampled at the second time by a second set of storage elements.

17. The method of claim 16, comprising:
receiving, from the first parity generator, a third parity check indicating parity of data sampled at a third time after the first time by the first set of storage elements;
receiving, from the second parity generator, a fourth parity check indicating parity of data sampled at a fourth time by the first set of storage elements;
detecting a second difference between the third parity check and the second parity check; and
determining, as a result of detecting the first difference and the second difference within a defined period of time, an occurrence of a timing error in the logic circuit.

18. The method of claim 17, comprising:
modifying an operating characteristic of the logic circuit in response to determining the occurrence of the timing error.

19. The method of claim 18, wherein the operating characteristic is a power characteristic of the logic circuit.

20. The method of claim 18, wherein the operating characteristic is a clock rate of at least one clock signal of a first clock signal and a second clock signal.

21. A system, comprising:
a set of data inputs;
a first clock;
a second clock;
a first set of storage elements coupled to the set of data inputs and coupled to the first clock;
a second set of storage elements coupled to the set of data inputs and coupled to the second clock;
a first parity generator coupled to the set of data inputs;
a second parity generator coupled to the first set of storage elements;
a set of output selection units coupled to the first set of storage elements and the second set of storage elements, the set of output selection units that selectively provide data from first outputs of the first set of storage elements or second outputs of the second set of storage elements;
an error correction unit coupled to the first parity generator and the second parity generator;
a parity storage element coupled to the first clock; and
a delay unit coupled between the first parity generator and the parity storage element, the delay unit receiving a first parity check output by the first parity generator, and outputting the first parity check to the parity storage element after a time delay period provided by the delay unit.

22. The system of claim 21 wherein the first set of storage elements samples the set of data inputs at a first time and the second set of storage elements samples the set of data inputs at a second time.

23. The system of claim 22 wherein the first parity generator generates a first parity check and the second parity generator generates a second parity check.

24. The system of claim 23, wherein the error correction unit is configured to:
detect an error status based on a difference between the first parity check and the second parity check,
select output from the first set of storage elements or the second set of storage elements in response to a first error condition for the error status, and
control an operating characteristic of at least one set of the first set of storage elements and the second set of storage elements in response to a second error condition for the error status.

25. The system of claim 24, wherein the first error condition corresponds to a systematic error and the second error condition corresponds to a single event error.

26. The system of claim 25, wherein the parity storage element obtains the first parity check at the first time and provides an output to the error correction unit based on the first parity check.

27. The system of claim 24, wherein the error correction unit adjusts a timing of the first clock or the second clock as a result of determining the second error condition.

28. The system of claim 24, comprising:
a dynamic scaling unit that causes power adjustment of power applied to at least one set of storage elements of the first set of storage elements and the second set of storage elements, wherein the error correction unit adjusts a power characteristic of power supplied to at least one set of storage elements of the first set of storage elements and the second set of storage elements based on the error status determined.

29. The system of claim 24, comprising:
a dynamic scaling unit that causes adjustment for at least one timing of the first time or the second time based on the error status determined.

* * * * *